US012790708B2

(12) United States Patent
Dewanjee et al.

(10) Patent No.: US 12,790,708 B2
(45) Date of Patent: Nov. 10, 2026

(54) DURABLE POROUS STRUCTURES AND ELECTRONIC DEVICES INCORPORATING THE SAME

(71) Applicants: Toyota Motor Engineering & Manufacturing North America, Inc., Plano, TX (US); The Board of Trustees of the University of Illinois, Urbana, IL (US)

(72) Inventors: Sujan Dewanjee, Urbana, IL (US); Gaurav Singhal, Mumbai (IN); Nenad Milijkovic, Urbana, IL (US); Paul Braun, Champaign, IL (US); Danny Lohan, Northville, MI (US); Shailesh Joshi, Ann Arbor, MI (US)

(73) Assignees: TOYOTA MOTOR ENGINEERING & MANUFACTURING NORTH AMERICA, INC., Plano, TX (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 638 days.

(21) Appl. No.: 18/193,711

(22) Filed: Mar. 31, 2023

(65) Prior Publication Data

US 2024/0328024 A1 Oct. 3, 2024

(51) Int. Cl.

| | |
|---|---|
| ***C25D 5/00*** | (2006.01) |
| ***C25D 3/38*** | (2006.01) |
| ***C25D 5/18*** | (2006.01) |
| ***C25D 7/00*** | (2006.01) |
| ***H05K 1/181*** | (2026.01) |
| ***H05K 3/10*** | (2006.01) |

(52) U.S. Cl.

CPC ............... *C25D 5/623* (2020.08); *C25D 3/38* (2013.01); *C25D 5/18* (2013.01); *C25D 7/00* (2013.01); *H05K 1/181* (2013.01); *H05K 3/10* (2013.01)

(58) Field of Classification Search

CPC ............. C25D 5/18; C25D 5/623; C25D 5/10
See application file for complete search history.

(56) References Cited

U.S. PATENT DOCUMENTS

| | | | | |
|---|---|---|---|---|
| 4,826,578 | A * | 5/1989 | Masuda | F28D 15/046 205/112 |
| 6,440,289 | B1 | 8/2002 | Chu et al. | |
| 9,711,799 | B1 | 7/2017 | Sheng et al. | |
| 2002/0130046 | A1 | 9/2002 | Robin et al. | |
| 2010/0193365 | A1* | 8/2010 | Lopatin | H01M 4/661 204/203 |
| 2018/0230615 | A1* | 8/2018 | Yaegashi | C25D 1/08 |
| 2019/0226110 | A1* | 7/2019 | Gupta | C25D 5/18 |

FOREIGN PATENT DOCUMENTS

| | | |
|---|---|---|
| KR | 100572433 B1 | 4/2006 |
| WO | 2018033862 A1 | 2/2018 |

* cited by examiner

*Primary Examiner* — Brian W Cohen
(74) *Attorney, Agent, or Firm* — Dinsmore & Shohl LLP

(57) ABSTRACT

In one embodiment, a method of fabricating a porous structure includes applying a first electroplating current at first current density for a first period of time, wherein the first electroplating current is a constant current, and applying a second electroplating current at a second current density for a second period of time following the first period of time, wherein the second electroplating current is a pulsed current and the first electroplating current and the second electroplating current grows the porous structure on a surface of the substrate.

14 Claims, 9 Drawing Sheets

DURABLE POROUS STRUCTURES AND ELECTRONIC DEVICES INCORPORATING THE SAME

TECHNICAL FIELD

The present specification generally relates to cooling structures for electronics assemblies and, more specifically, to durable porous structures for receiving a cooling fluid to cool heat-generating devices in electronics assemblies.

BACKGROUND

Cooling fluid may be used to receive heat generated by a heat-generating device by thermal transfer, and remove such heat from the heat-generating device. For example, cooling fluid may be directed toward a semiconductor-cooling chip to remove heat that it generates. For small electronic devices such as integrated circuits, a microchannel heat sink may be used to accommodate the small size of these devices.

Power electronics devices are designed to operate at increased power levels and generate increased corresponding heat flux due to the demands of newly-developed electrical systems. Conventional heat sinks may be unable to adequately remove sufficient heat to effectively lower the operating temperature of the electronics assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall electronics modules and make their thermal management challenging.

Due to the trending demand of high efficiency, integrated-functionality and compact form factor, the power density of power electronics devices has been inevitably increasing. As a result, the thermal management of such power-dense electronics modules requires higher heat dissipation capability with balanced pumping power requirement. Accordingly, innovative cooling solutions are desirable to address the thermal management requirements of these power-dense electronics modules.

SUMMARY

In one embodiment, a method of fabricating a porous structure includes applying a first electroplating current at first current density for a first period of time, wherein the first electroplating current is a constant current, and applying a second electroplating current for a second period of time following the first period of time, wherein the second electroplating current is a pulsed current with low current density than the first current density and the first electroplating current and the second electroplating current grows the porous structure on a surface of the substrate.

In another embodiment, an electronics assembly includes a base substrate comprising a target surface and a heating surface opposite from the target surface, an electrodeposited porous structure grown on the target surface, the electrodeposited porous structure a porosity of 30%-40% at the cross section that is substantially thickened uniformly throughout a thickness of the electrodeposited porous structure using pulsed low current density, wherein the electrodeposited porous structure receives a cooling fluid, and an electronic device coupled to the heating surface These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
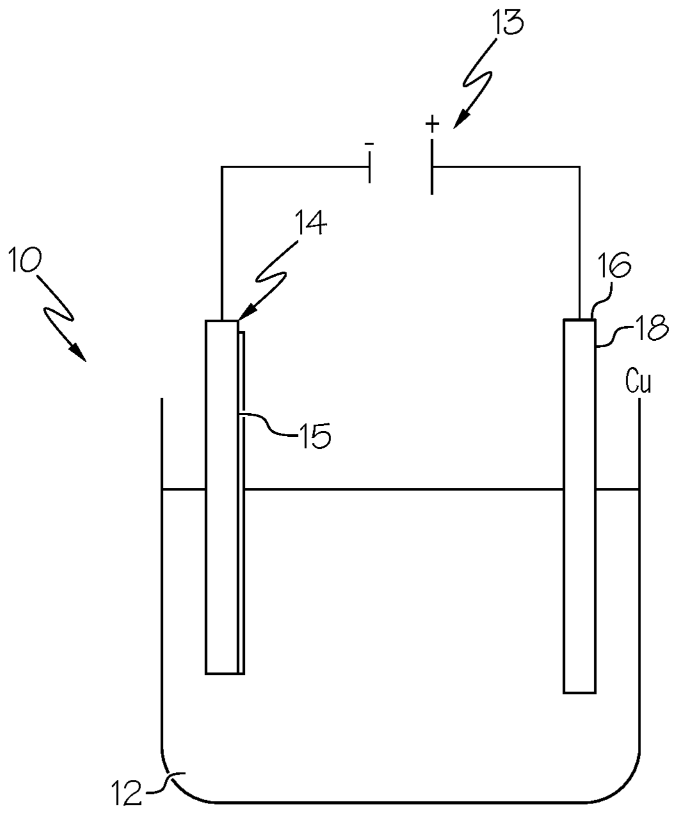
FIG. 1 schematically illustrates an example system for forming porous structures according to one or more embodiments described and illustrated herein.

Various embodiments described herein are directed to porous structures having uniform porosity and increased durability that may be used in cooling devices for electronic assemblies. Porous structures may be desirable for use in cooling devices, such as two-phase cooling devices, because they provide additional and enhanced nucleation sites for cooling fluid boiling.

Such porous structures may be formed by an electrodeposition process. In a typical electrodeposition process, an electrically conductive base substrate is disposed in an electroplating bath having metal cations. A constant electroplating current is applied between an anode in the electroplating bath and a cathode electrically coupled to the base substrate. Over a period of time, the metal cations are plated onto a target surface of the base substrate. Highly porous structures can be created by applying an electroplating current having a constant current density within the range of 1 $A/cm^2$ to 3 $A/cm^2$, for example. However, the porosity of porous structures fabricated from this process tends to decrease in a direction away from the base substrate. This results in a thinner stem with less porous head at the top, making the whole structure fragile and prone to delaminate from the substrate. Studies have shown that, using low constant current after the first electroplating current can reduce the delamination of these structures. But constant low current makes the top head of the structures bulky and smoother having less effect on the stem. Therefore the resulting structures are not thickened uniformly throughout the cross-section keeping still susceptive to delamination. On the other hand smoothening of the top surface reduce the micro-nano structures and allowing less active surface area to activate as nucleation sites during phase change heat transfer. Therefore, the effectiveness in encouraging boiling of these porous structures is undesirably reduced.

Further, structures that are thicker on top and shallower on the bottom tend to break easily at the bottom. As such, the porous structures fabricated from this process tend to be very fragile and not durable, and therefore are not practical in real-world applications such as electronic device cooling.

There have been attempts to create porous structures having increased durability by sintering the porous structure after the electrodeposition process. However, sintering causes further smoothing of the porous structure. Thus, sintering further reduces the porosity of the porous structure, thereby making it less effective.

Embodiments of the present disclosure provide methods of fabricating porous structures having increased durability and substantially uniform porosity throughout the thickness by a two-step electroplating current application process. As used herein, the phrase "substantially uniform thickening of the structure throughout the cross section" means that the structure thickening of the porous structure does not deviate by more than 20% in a direction orthogonal to the target surface.

In a first step, a first electroplating current having a constant current density is applied to the electroplating bath for a first period of time. The first electroplating current ensures proper plating of metal cations on a target surface of a base substrate with a targeted thickness of the porous structure within the electroplating bath. After the period of time, a pulsed second electroplating current is applied to the electroplating bath. The present inventors have found that a pulsed electroplating current forms durable porous structures having substantially uniform thickening throughout the thickness that are more durable than porous structures fabricated from the traditional application of constant electrodeposition current.

Various embodiments of methods for fabricating porous structures and electronics assemblies including porous structures are described in detail below.

To generate the metal porous structure, a metal 16 may be electrodeposited through cathodic deposition onto a target surface 15 of an electrically conductive substrate. Referring now to FIG. 1, a process of electroplating the metal 16 to the target surface 15 is schematically illustrated. An electroplating bath 10 including a solution 12 having metal ions is prepared. The metal 16 chosen should have a relatively low coefficient of thermal expansion. In a non-limiting example, copper may be used to electroplate the target surface 15. Therefore copper ions may be provided within the solution 12. The solution 12 may be a copper ion solution of sulfuric acid and copper sulfate as a non-limiting example. The target surface 15 is submerged within the solution 12 of the electroplating bath 10. Additionally, an electrode 18 is submerged within the solution 12 of the electroplating bath 10. The electrode 18 should be the same material as the metal 16.

A voltage source 13 is electrically coupled to both the target surface 15 of the substrate 14 and the electrode 18. In the illustrated example, the positive terminal of the voltage source 13 is electrically coupled to the electrode 18 and the negative terminal of the voltage source 13 is electrically coupled to the target surface 15. Thus, the electrode 18 is the anode and the target surface 15 is the cathode. Electric current is provided by the voltage source 13 through the target surface 15 and the electrode 18.

In some embodiments, before the substrate 14 is deposited in the electroplating bath, a metal layer (not shown) may be deposited onto the target surface 15, producing an electrically conductive layer, particular in cases where the substrate 14 is not electrically conductive (e.g., silicon). The metal layer may be copper, nickel, or any other electrically conductive material. In embodiments, the metal layer may include the same type of metal used in the metal porous structure. A gold layer may also be deposited on the metal layer. The gold layer protects the metal layer from oxidation.

As described in more detail below, applying a current at a constant DC current density will produce a fragile porous structure having a porosity that decreases in a direction away from the target surface 15. Embodiments of the present disclosure provide a method that creates a durable porous structure having a more uniform thickening throughout the cross section porosity by first applying a constant current density for a first period of time and a then a subsequent pulsed current for a second period of time.

Figure 2:
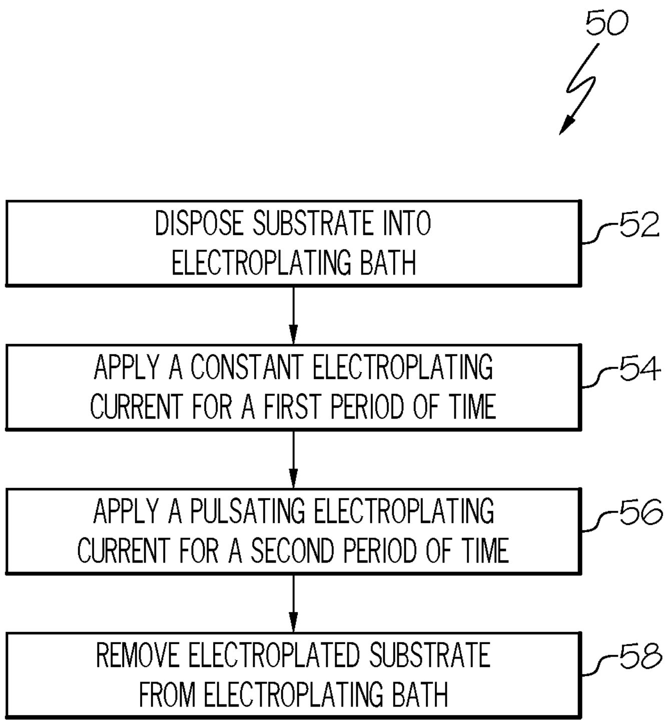
FIG. 2 illustrates a flowchart of an example method for forming porous structures according to one or more embodiments described and illustrated herein.

Referring now to FIG. 2, an example process 50 for forming a durable porous structure is illustrated. At block 52, the substrate 14 is deposited into the electroplating bath 10 as shown in FIG. 1. At block 54, a constant electroplating current for a first period of time at a first current density is applied to the target surface 15 of the substrate 14. The first current density may be within a range of 1 $A/cm^2$ to 5 $A/cm^2$, including endpoints, within a range of 2 $A/cm^2$ to 3 $A/cm^2$, including endpoints, or about 3 $A/cm^2$. The first period of time may have a duration within a range of 20 seconds to 60 seconds, including endpoints, within a range of 25 seconds to 40 seconds, including endpoints, within a range of 30 seconds to 40 seconds, including endpoints, or about 30 seconds. The first current density forms the base portion of the porous structure.

Next, at block 56, immediately following the first period of time, a pulsating electroplating current is applied for a second period of time. The second period of time may be within a range of one minute to thirty-five minutes, including endpoints, depending on the desired thickness of the porous substrate. The second electroplating current density may be within a range of 10 $mA/cm^2$ and 300 $mA/cm^2$, including endpoints, within a range of 75 $mA/cm^2$ and 225 $mA/cm^2$, including endpoints, or about 100 $mA/cm^2$. Embodiments are not limited by any particular duty cycle. However, the present inventors have found that a duty cycle defined by one second on followed by four seconds off works particularly well.

After completion of the second period of time, the substrate 14 is removed from the electroplating bath at block 58.

Figure 3A:
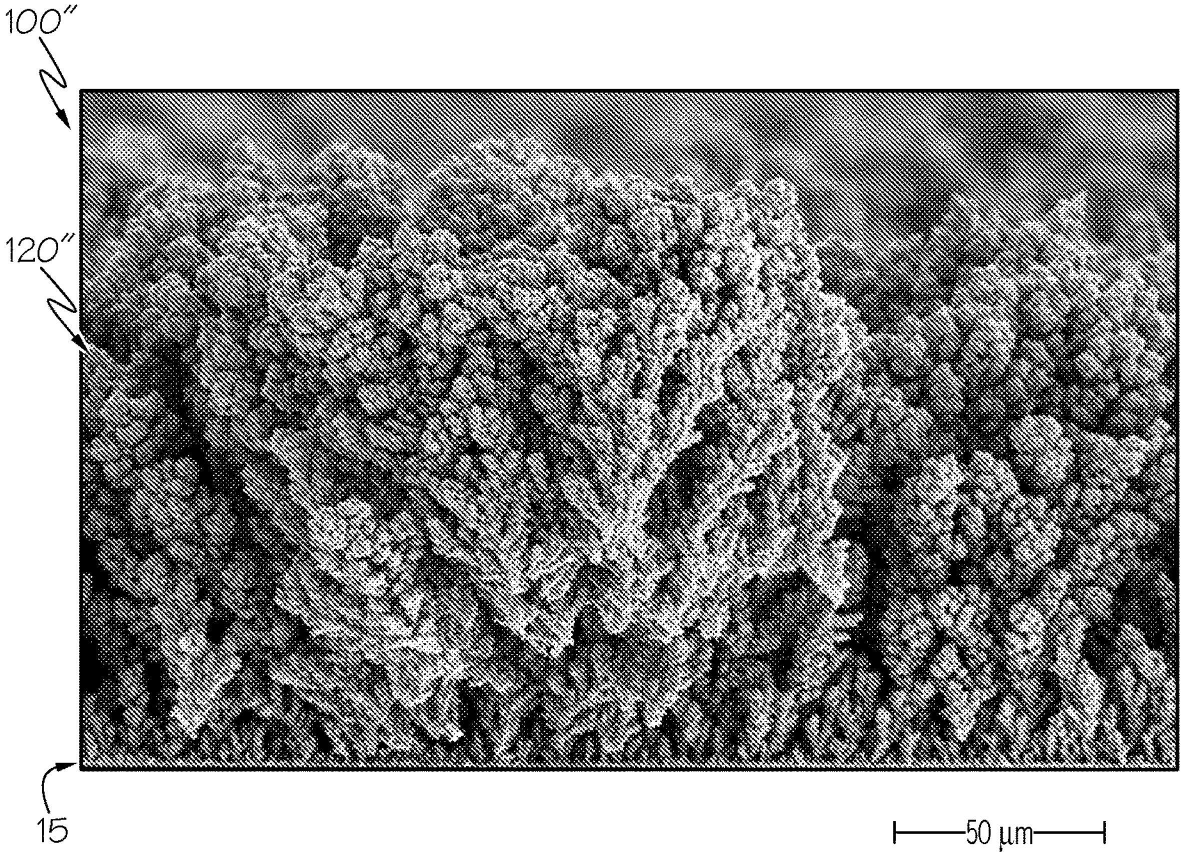
FIG. 3A is a digital image of the cross section of a porous assembly after an electroplating duration of time according to one or more embodiments described and illustrated herein.

FIG. 3A illustrates an example of the cross section of porous assembly 100" comprising a target surface 15 of a base substrate 14 and a porous structure 120" after applying a constant current density of 3 $A/cm^2$ for thirty seconds and a pulsed current (100 $mA/cm^2$, one second on, four seconds off) for sixty duty cycles. FIG. 3A shows a porous structure 120" having a uniform thickening of the porous structure with a large surface area providing nucleation sites. The porous structure is defined by a network of pores having a diameter of 100 micrometers or less.

Figure 3B:
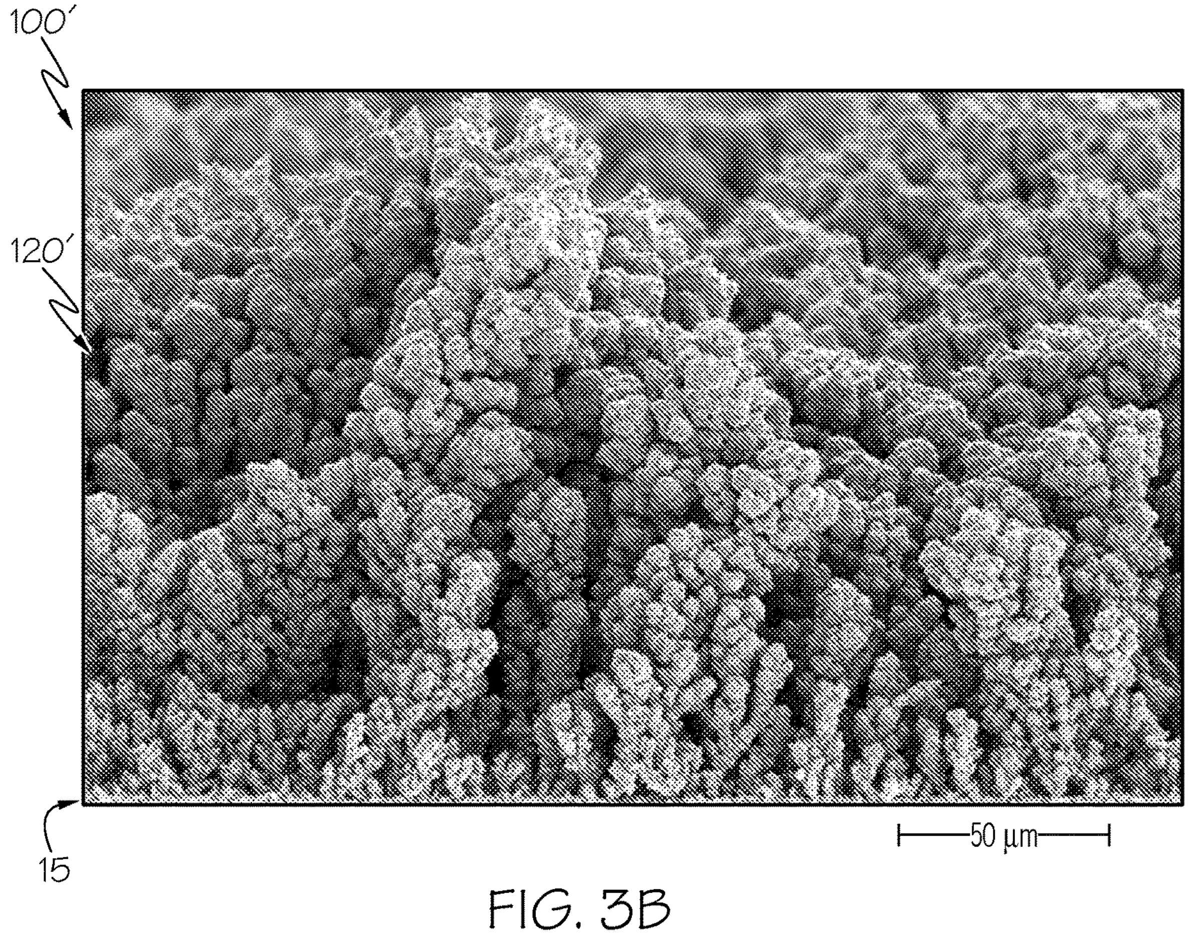
FIG. 3B is a digital image of the cross section of a porous assembly after another electroplating duration of time according to one or more embodiments described and illustrated herein.
Figure 3C:
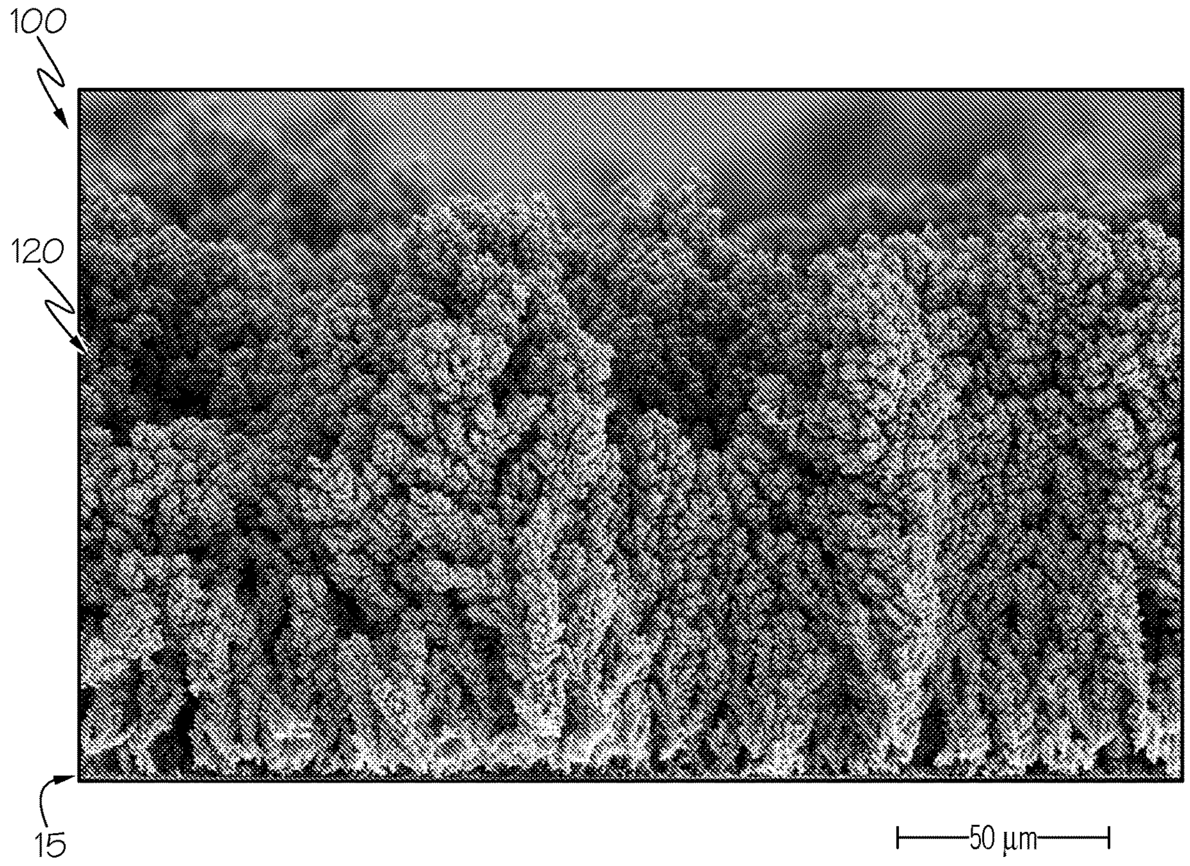
FIG. 3C is a digital image of the cross section of a porous assembly after another electroplating duration of time according to one or more embodiments described and illustrated herein.

FIG. 3B illustrates an example of the cross section of porous assembly 100' using the same first current density and first period of time as that of FIG. 3A but with a second period of time of pulsed current (100 mA/cm$^2$ at one second on, four seconds off for 720 duty cycles) that results in a porous structure 120'. FIG. 3C illustrates an example porous assembly 100 using the same first current density and first period of time as that of FIG. 3A but with a second period of time of pulsed current (100 mA/cm$^2$ at one second on, four seconds off for 1920 duty cycles) that results in a porous structure 120.

Reviewing the examples of FIGS. 3A-3C, it is shown that the thickening of the porous structures 120, 120', 120" is consistent in a direction from the target surface 15 to the top of the porous structure 120, 120', 120". The uniform thickening of the structure provides a more durable porous structure than those formed using a constant low current density electroplating for thickening electrodeposited porous structure.

Figure 4A:
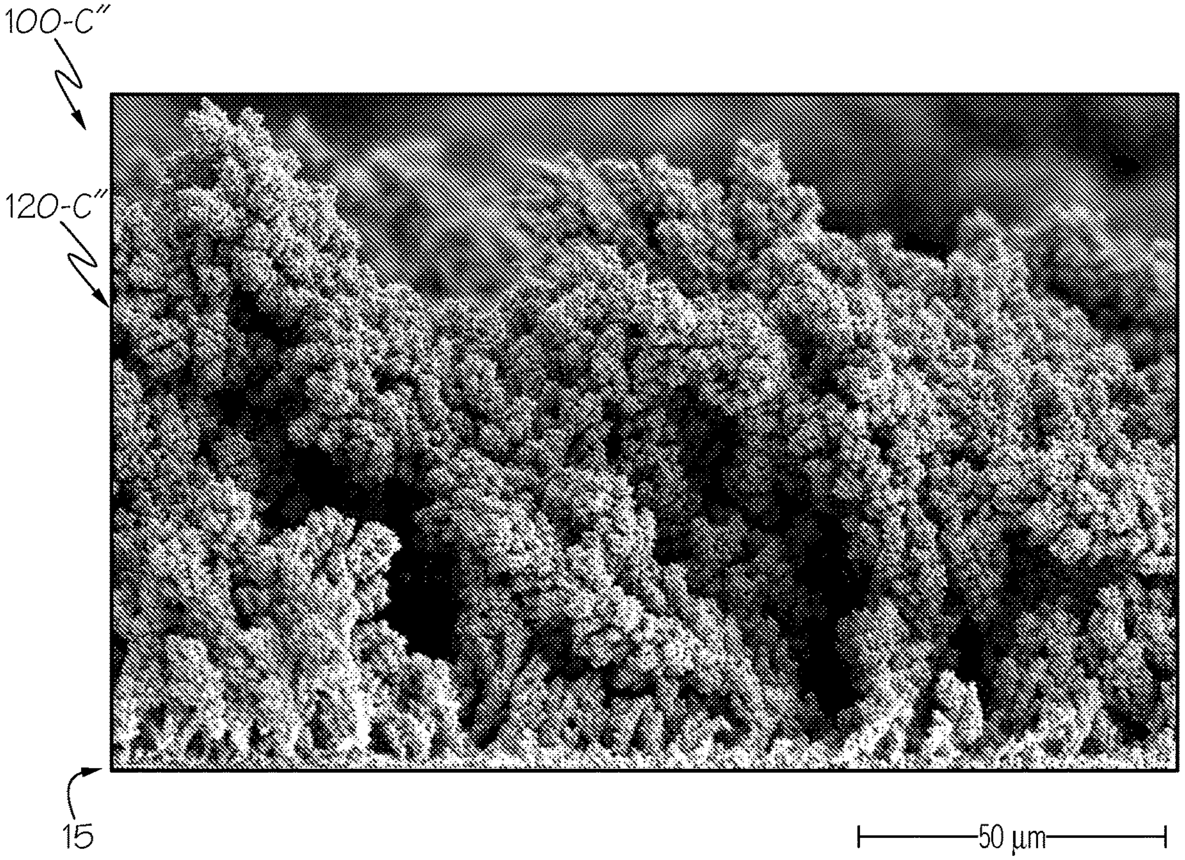
FIG. 4A is a digital image of the cross section of a comparative example porous assembly using a constant current density after a duration of time.
Figure 4B:
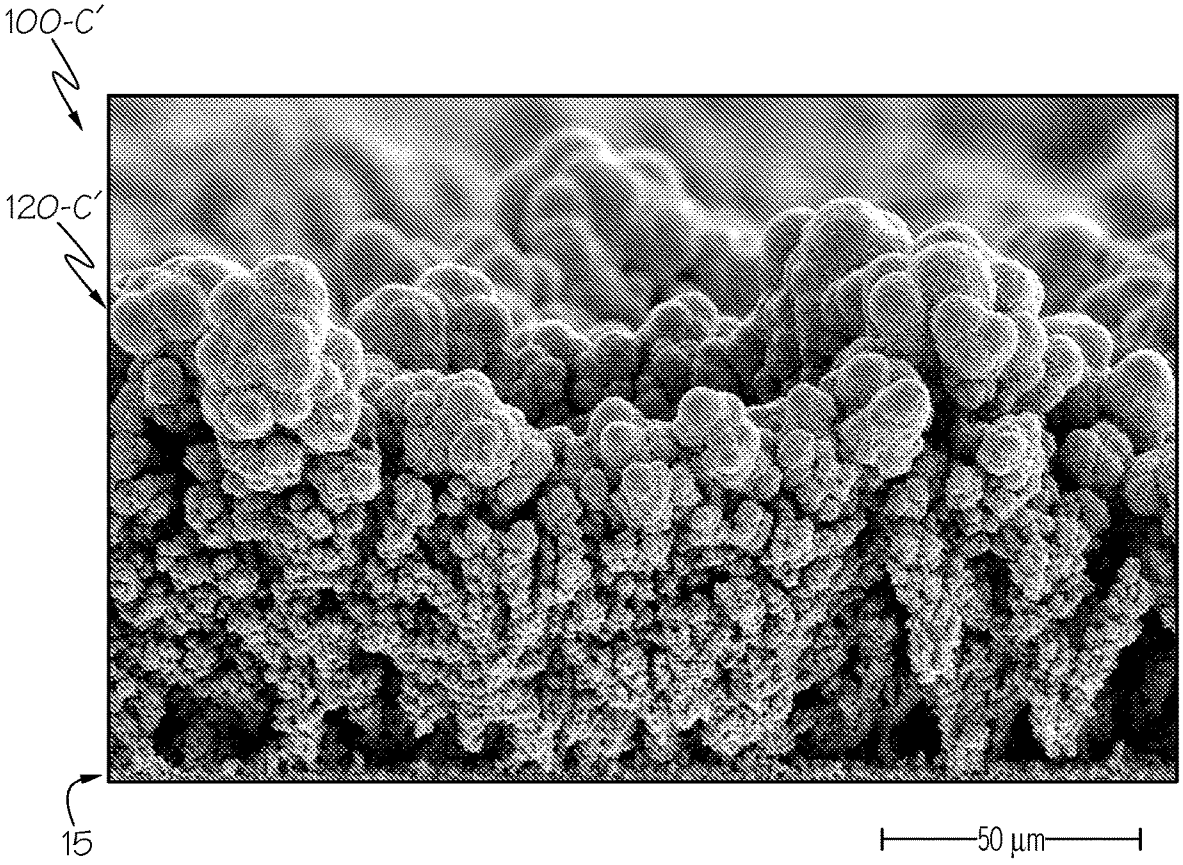
FIG. 4B is a digital image of the cross section of a comparative example porous assembly using a constant current density after another duration of time.
Figure 4C:
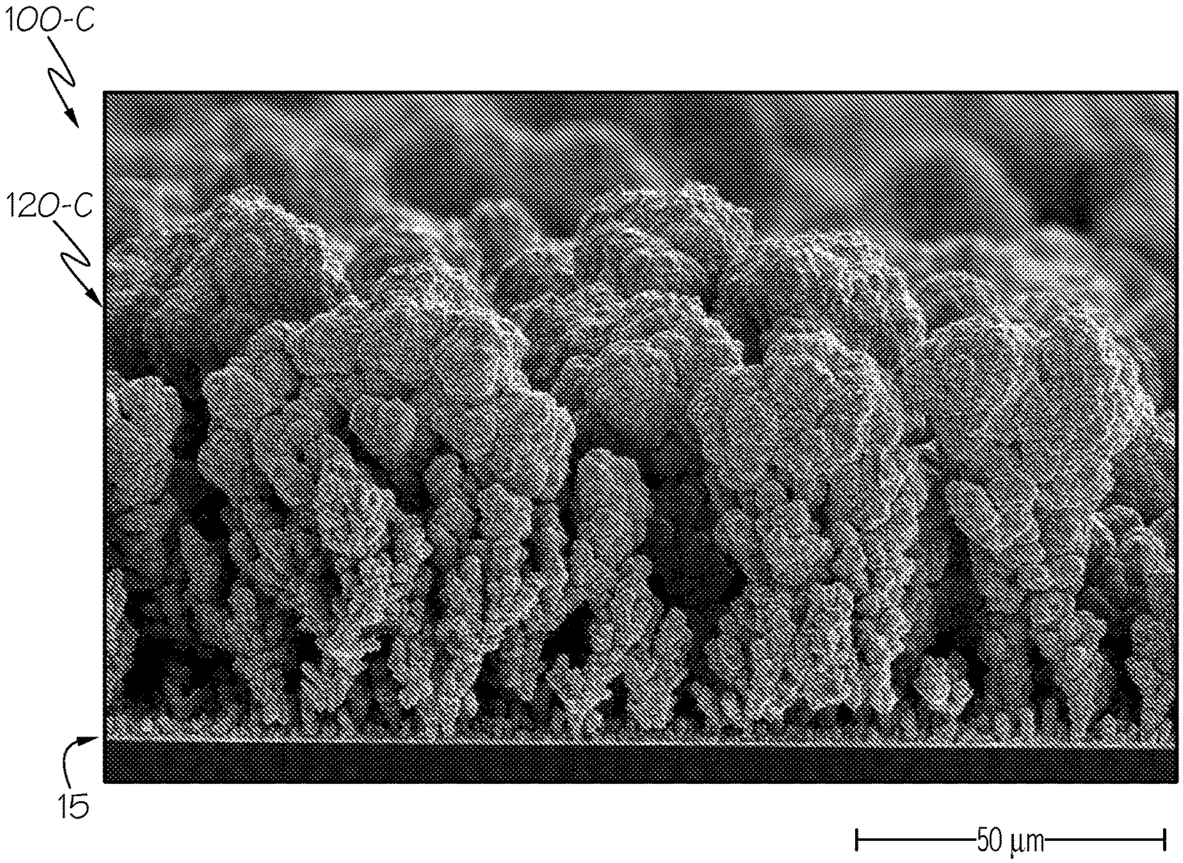
FIG. 4C is a digital image of the cross section of a comparative example porous assembly using a constant current density after another duration of time.

FIGS. 4A-4C provide comparative examples using constant low current density without a pulsating current. FIG. 4A shows the cross section of a porous assembly 100-C" having a porous structure 120-C" resulting from a constant current density of 3 A/cm$^2$ for thirty seconds and then one minute of low constant current plating (100 mA/cm$^2$). FIG. 4B shows a porous assembly 100-C' having a porous structure 120-C' resulting from a constant current density of 3 A/cm$^2$ for thirty seconds and then on for 12 minutes of low constant current plating (100 mA/cm$^2$). FIG. 4C shows a porous assembly 100-C having a porous structure 120-C resulting from a constant current density of 3 A/cm$^2$ for thirty seconds and then 32 minutes of low constant current plating (100 mA/cm$^2$). FIGS. 4A-4C show that the porosity of the porous structures 120-C, 120-C', 120-C is significant reduced in a direction away from the target surface 15 and the thickening of the structures higher at the top and lower at the bottom which is not uniform. The smoothening at the top of the structures reduces the micro-nanostructures, hence the porosity of the structure. The lower porosity and smoothened surface results in having less surface area for nucleation sites. Further, the porous structure becomes "top heavy" which causes it to become more fragile and easily broken because the lower portions cannot easily support the denser top portions.

In comparing the examples of FIGS. 3A-3C with the corresponding comparative examples of FIGS. 4A-4C, it is shown that the low pulsating current samples of FIGS. 3A-3C are about 31% more micro nanostructured, hence have about 31% more surface area than the constant low current samples of FIGS. 4A-4C. Further, the low pulsating current samples of FIGS. 3A-3C are about 25% more uniformly thickened throughout the cross section than the constant current samples of FIGS. 4A-4C, hence about 25% more durable. The pulse plated samples also survive fast bubble generation at critical heat flux during pool boiling test at standard atmospheric pressure.

The porous structures described herein may be incorporated into cooling structures, such as cooling structures for electronics assemblies. Porous structure heat sinks may be used to receive heat generated by a heat-generating device by heat transfer, and remove such heat from a heat-generating device when cooling fluid is ran through the porous structure, or otherwise evaporated on the porous structure.

The metal porous structure 120 is thermally coupled to the target surface 15 and functions to increase the surface area of the target surface 15. The increased surface area may result in increased heat flux to the surrounding environment and, thus, increased cooling capabilities.

Figure 5:
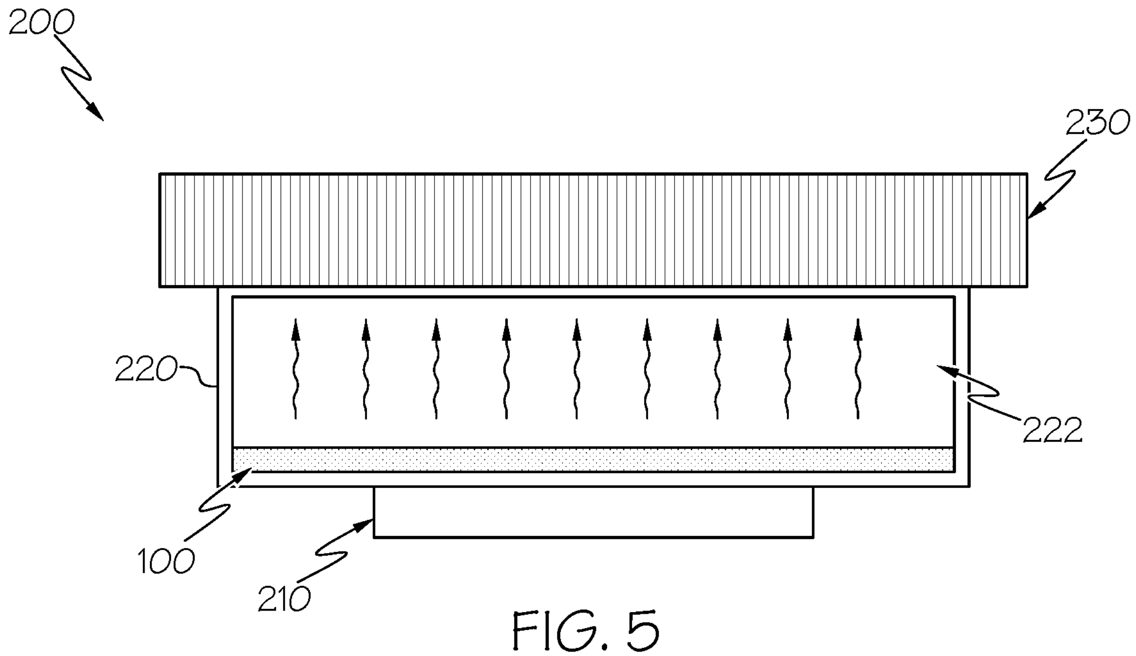
FIG. 5 schematically illustrates an example electronics assembly incorporating a porous assembly according to one or more embodiments described and illustrated herein.

FIG. 5 illustrates a non-limiting example of an electronics assembly 200 that incorporates the porous assemblies described herein. The electronics assembly 200 generally includes an electronic device 210 coupled to a first side of a vapor chamber 220, and a heat sink 230 is attached to an opposite side of the vapor chamber. The electronic device 210 may be any electronic device that generates heat, such as, without limitation, a power bi-polar transistor, a metal-oxide-semiconductor field-effect transistor (MOSFET), an insulated-gate bi-polar transistor (IGBT), a silicon coated rectifier (SCR), and/or the like. The electronic device 210 may be a component of an inverter circuit for an electrified vehicle, for example.

The vapor chamber 220 defines a cavity 222 that receives a cooling fluid. An evaporator surface of the vapor chamber 220 is defined by a porous assembly 100 formed using a electrodeposition for targeted period of time at some high constant current followed by a pulsed electroplating current as described above. Thus, it has a porous structure with a substantially uniform thickening throughout the cross section making it durable. Heat from the electronic device 210 (or other heat generating device) is transferred to the porous assembly 100, which is in contact with the cooling fluid (e.g., deionized water). The heat warms the cooling fluid, causing it to boil. The porous structure of the porous assembly 100 provided enhanced nucleation sites to encourage boiling. The cooling fluid changes from liquid phase to gas phase such that the vapor rises toward a condensing surface which is cooled by the heat sink 230 (or other cooling structure/device). Heat is removed from the electronics assembly 200 by the heat sink 230. The cooling fluid changes from vapor to liquid at the condensing surface defined by the heat sink 230.

In other embodiments, the porous assemblies described herein may be incorporated in single-phase cooling structures where cooling fluid passes through the porous networks defined by the porous assemblies.

It should now be understood that embodiments of the present disclosure are directed to structures and methods that provide enhanced nucleation sites and durability of the porous structure that is used for cooling of a heat-generating device. Cooling fluid passing through metal porous structures may receive heat of the heat-generating device, specifically, power electronic devices with increased power density. The cooling fluid may be encouraged to boil using the porous network of the porous structures described here. Methods for fabricating more durable porous structures having substantially uniform thickening of the porous structure throughout the cross section include electroplating a target surface using a first current density for a first period of time followed by a pulsed electrical current for a second period of time. The pulsed electrical current ensures substantially uniform thickening of the porous structure throughout the thickness of the porous structure.

It is noted that recitations herein of a component of the present invention being "configured" in a particular way, "configured" to embody a particular property, or function in a particular manner, are structural recitations as opposed to recitations of intended use. More specifically, the references herein to the manner in which a component is "configured" denotes an existing physical condition of the component and, as such, is to be taken as a definite recitation of the structural characteristics of the component.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising".

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A method of fabricating a porous structure comprising:

depositing a substrate in an electroplating bath;

applying a first electroplating current at first current density for a first period of time, wherein the first electroplating current is a constant current; and applying a second electroplating current at a second current density for a second period of time following the first period of time, wherein the second electroplating current is a pulsed current density and the first electroplating current and the second electroplating current grows the porous structure on a surface of the substrate;

wherein the first current density is greater than the second current density;

wherein the porous structure formed by the first and second electroplating currents exhibits a uniformity of thickening that deviates by no more than 20% across the thickness of the porous structure, as measured in a direction orthogonal to the target surface.

2. The method of claim 1, wherein the porous structure is copper.

3. The method of claim 1, wherein the porous structure has a porosity in the range of 30% to 40% at the cross section, including endpoints.

4. The method of claim 1, wherein the porous structure has a substantially uniform thickening of the structure throughout the cross section.

5. The method of claim 1, wherein the porous structure is defined by a network of pores having a diameter of 100 micrometers or less.

6. The method of claim 1, wherein the porous structure has a substantially uniform thickness.

7. The method of claim 1, wherein the first current density is within a range of 1 $A/cm^2$ to 5 $A/cm^2$, including endpoints.

8. The method of claim 1, wherein the first current density is about 3 $A/cm^2$.

9. The method of claim 1, wherein the first period of time is within a range of 20 seconds to 60 seconds.

10. The method of claim 1, wherein the first period of time is about 30 seconds.

11. The method of claim 1, wherein the second current density is a within a range of 10 $mA/cm^2$ and 300 $mA/cm^2$, including endpoints.

12. The method of claim 1, wherein the second electroplating current density is about 100 $mA/cm^2$.

13. The method of claim 1, wherein a duty cycle of the second electroplating current is defined by one second on followed by four seconds off.

14. The method of claim 1, wherein:

the first period of time is about 30 seconds;

the first current density is about 3 $A/cm^2$; and the second current density is about 100 $mA/cm^2$ with a duty cycle defined by one second on and four seconds off.

* * * * *